United States Patent [19]
Okunuki et al.

[11] Patent Number: 4,974,736
[45] Date of Patent: Dec. 4, 1990

[54] MULTI-ELECTRON-BEAM PATTERN DRAWING APPARATUS

[75] Inventors: Masahiko Okunuki, Tokyo; Mitsuaki Seki, Machida; Isamu Shimoda, Zama; Mamoru Miyawaki, Tokyo; Takeo Tsukamoto, Atsugi; Akira Suzuki; Tetsuya Kaneko, both of Yokohama; Toshihiko Takeda, Tokyo, all of Japan

[73] Assignee: Canon Kabushiki Kaisha, Tokyo, Japan

[21] Appl. No.: 469,730

[22] Filed: Jan. 24, 1990

Related U.S. Application Data

[63] Continuation of Ser. No. 186,925, Apr. 27, 1988, abandoned.

[30] Foreign Application Priority Data

Apr. 28, 1987 [JP] Japan ................. 62-103021
Apr. 28, 1987 [JP] Japan ................. 62-103022
Apr. 28, 1987 [JP] Japan ................. 62-103024
Apr. 28, 1987 [JP] Japan ................. 62-103029
Apr. 28, 1987 [JP] Japan ................. 62-103035

[51] Int. Cl.⁵ .......................... B23K 15/00
[52] U.S. Cl. .................. 219/121.12; 219/121.3; 219/121.26; 219/121.28; 250/492.3; 250/492.2; 250/491.1
[58] Field of Search .............. 219/121.12, 121.16, 219/121.19, 121.27, 121.28, 121.18, 121.20, 121.30; 250/492.2, 492.3, 398, 491.1

[56] References Cited

U.S. PATENT DOCUMENTS 4,584,479  4/1986  Lamattina et al. ............. 250/441.1
4,694,178  9/1987  Harte ......................... 250/492.2
4,718,019  1/1988  Fillion et al. ................ 250/398 X
4,789,945 12/1988  Niijima ....................... 250/452.2
4,810,889  3/1989  Yokomatsu et al. ............. 250/492.2

FOREIGN PATENT DOCUMENTS 109147  5/1984  European Pat. Off. .
213664  3/1987  European Pat. Off. .
2177847 1/1987  United Kingdom .

OTHER PUBLICATIONS

Patent Abstracts of Japan, vol. 7, No. 36, Feb. 15, 1983, Kokai No. 57-187,849, May, 1981.
Patent Abstracts of Japan, vol. 8, No. 131, Jun. 19, 1984, Kokai No. 59-41,831, Mar., 1984.

Primary Examiner—C. L. Albritton
Attorney, Agent, or Firm—Fitzpatrick, Cella, Harper & Scinto

[57] ABSTRACT

A multi-electron-beam pattern drawing apparatus having a plurality of electron beam sources and a plurality of electron beam sensors, provided on a common base member, is disclosed. The electron beam sources can be selectively driven for different uses, such as a pattern drawing (exposure) purpose and position detecting purpose, for example. In another aspect, the apparatus is provided with a function for correcting the pattern drawing magnification.

16 Claims, 11 Drawing Sheets

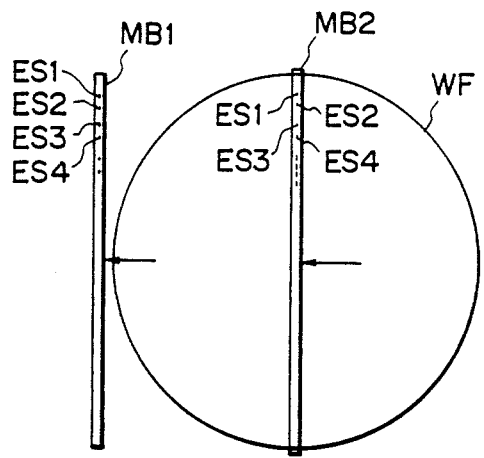
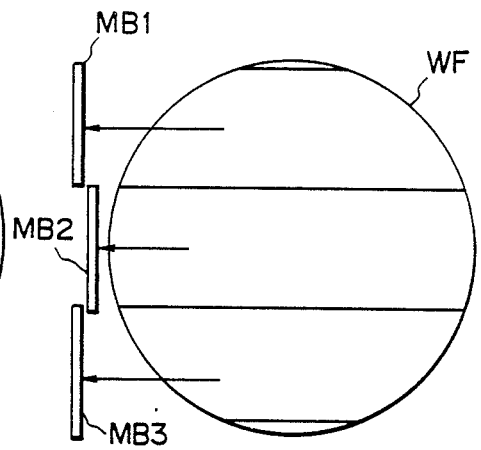
FIG. 6A
FIG. 6C
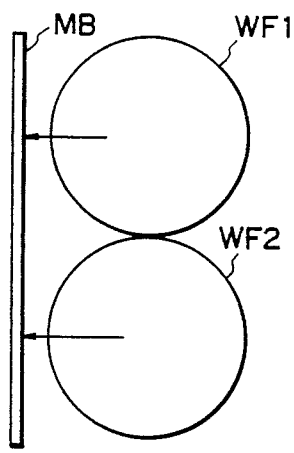
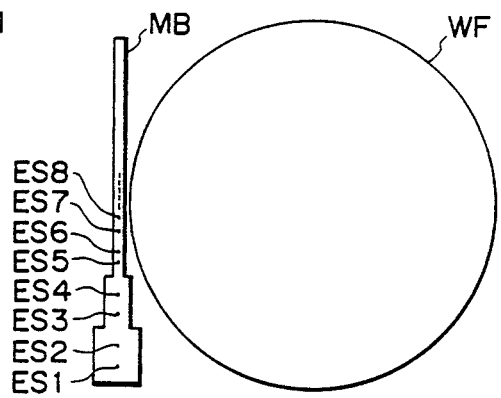
FIG. 6B
FIG. 6D

MULTI-ELECTRON-BEAM PATTERN DRAWING APPARATUS

This application is a continuation of application Ser. No. 07/186,925, filed Apr. 27, 1988, now abandoned.

FIELD OF THE INVENTION AND RELATED ART

This invention relates to an electron beam pattern drawing apparatus usable in the manufacture of semiconductor microcircuits and, more particularly, to a multi-electron-beam pattern drawing apparatus which includes a plurality of electron emitting sources. The present invention is applicable also to a charged-particle pattern drawing apparatus using charged particles such as ions, other than electrons.

Conventionally, efforts have been made to develop a multi-electron-beam pattern drawing apparatus wherein a plurality of electron producing sources are provided and electron flows emitted from these electron producing sources are focused and deflected, as desired, by suitable focusing and deflecting means, provided separately from the electron producing sources, whereby a desired circuit pattern is drawn on a semiconductor wafer.

Traditional electron emitting sources utilize emission of thermoelectrons from a hot cathode. However, this type of electron emitting sources involve problems of a large loss in energy due to heating, the necessity of provision of heating means, unstableness due to the use of heat, bulkiness which easily results in the bulkiness and complication of the pattern drawing apparatus including plural electron emitting sources, and so on.

In consideration of such inconveniences, studies have been made to develop an electron emitting source that does not rely on heating, but utilizes electron emission from a cold cathode, and various proposals and reports have been made. Examples of such an electron emitting source are as follows:

(1) An electron emitting element of the type that an inverse bias voltage is applied to a p-n junction to cause avalanche breakdown whereby electrons are emitted out of the element. This type of electron emitting element is disclosed in U.S. Pat. No. 4,259,678 and Japanese Laid-Open Patent Application, Laid-Open No. Sho54-111272.

(2) An MIM type electron emitting element wherein a layered structure of metal-insulator-metal is provided and wherein an electric voltage is applied between two metal layers, whereby electrons passed through the insulating layer due to the tunnel effect are emitted from the metal layer to the outside of the element.

(3) A surface conduction type electron emitting element wherein an electric voltage is applied to a high-resistance thin film in a direction perpendicular to the film direction, whereby electrons are emitted from the surface of the thin film to the outside of the element.

(4) A field-effect type (FE type) electron emitting element wherein an electric voltage is applied to a metal member having such shape that easily causes the electric field concentration, so that a high-density electric field is produced locally whereby electrons are emitted from the metal member to the outside of the element.

It has been considered to incorporate, into an electron beam pattern drawing apparatus and as a charged-particle producing source means, a plurality of electron emitting elements of the type wherein the emission of electrons from a cold cathode is utilized as described hereinbefore. In such an apparatus, more specifically, the emission of electrons from the electron producing sources may be selectively controlled so that the electrons are emitted patternwise, as desired, the emitted electrons impinging upon the surface of a workpiece such as a wafer, whereby a desired circuit pattern can be drawn on the workpiece by means of the electron beam exposure. Since the electron producing source means of the type described just above can be made compact, use of plural electron producing source means such as above in a multi-electron beam pattern drawing apparatus will be effective to reduce the size of the apparatus.

SUMMARY OF THE INVENTION

Usually, in conventional electron beam pattern drawing apparatuses, an additional light source should be used to allow execution of alignment, and this results in bulkiness and complication of the apparatus. Further, in order to meet any change in the size of chips on a wafer, it is necessary to displace one or more alignment mark detectors. The displacement of the detectors causes a problem of creation of minute foreign particles.

The alignment accuracy can be improved by simultaneously detecting plural alignment marks. However, to allow this, it is necessary to use plural detectors corresponding to the alignment marks to be detected and a plurality of signal processing circuits, such that mark signals can be detected distinguishably and respective mark positions can be detected exactly. This makes the apparatus bulky and complicated.

Usually, in order to improve the efficiency of electron beam production and/or to prevent attenuation of the emitted electron beam, an electron beam pattern drawing apparatus as a whole is disposed in a vacuum ambience. However, this requires the entire structure to be bulky.

Another problem is that, on an occasion when there occurs a change in the shape of a workpiece such as a wafer due to the effect of heat or otherwise, applied thereto in the course of processings such as a heat treatment or otherwise, it is very difficult to draw a circuit pattern in a predetermined pattern drawing range (e.g. one chip region) exactly in accordance with the pattern data which is preset.

Accordingly, it is an object of the present invention to provide a multi-electron-beam pattern drawing apparatus by which at least one of the above-described problems can be solved.

It is another object of the present invention to provide a multi-electron-beam pattern drawing apparatus having a simple and compact structure being capable of attaining high-precision processing (exposure) for manufacture of semiconductor chips of various sizes.

It is a further object of the present invention to provide a multi-electron beam pattern drawing apparatus which is capable of detecting any change in the shape of a workpiece such as a wafer and also capable of exactly drawing a desired circuit pattern within the range of each semiconductor chip irrespective of the change in the shape of the workpiece.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A, 2B and 2C show an example of an electron beam head usable in the electron beam apparatus of the FIG. 1 embodiment, wherein FIG. 2A is a bottom view, FIG. 2B is a section taken on a line B—B in FIG. 2A, and FIG. 2C is a section taken on a line C—C in FIG. 2A.

FIGS. 6A, 6B, 6C and 6D are schematic views, respectively, showing third, fourth, fifth and sixth embodiments of the present invention, respectively.

FIGS. 8 and 9 show an electron beam pattern drawing apparatus according to a seventh embodiment of the present invention, wherein FIG. 8 is a top plan view and FIG. 9 is a side view, both showing the positional relation of plural electron sources with a wafer.

DESCRIPTION OF THE PREFERRED EMBODIMENTS

Figure 1:
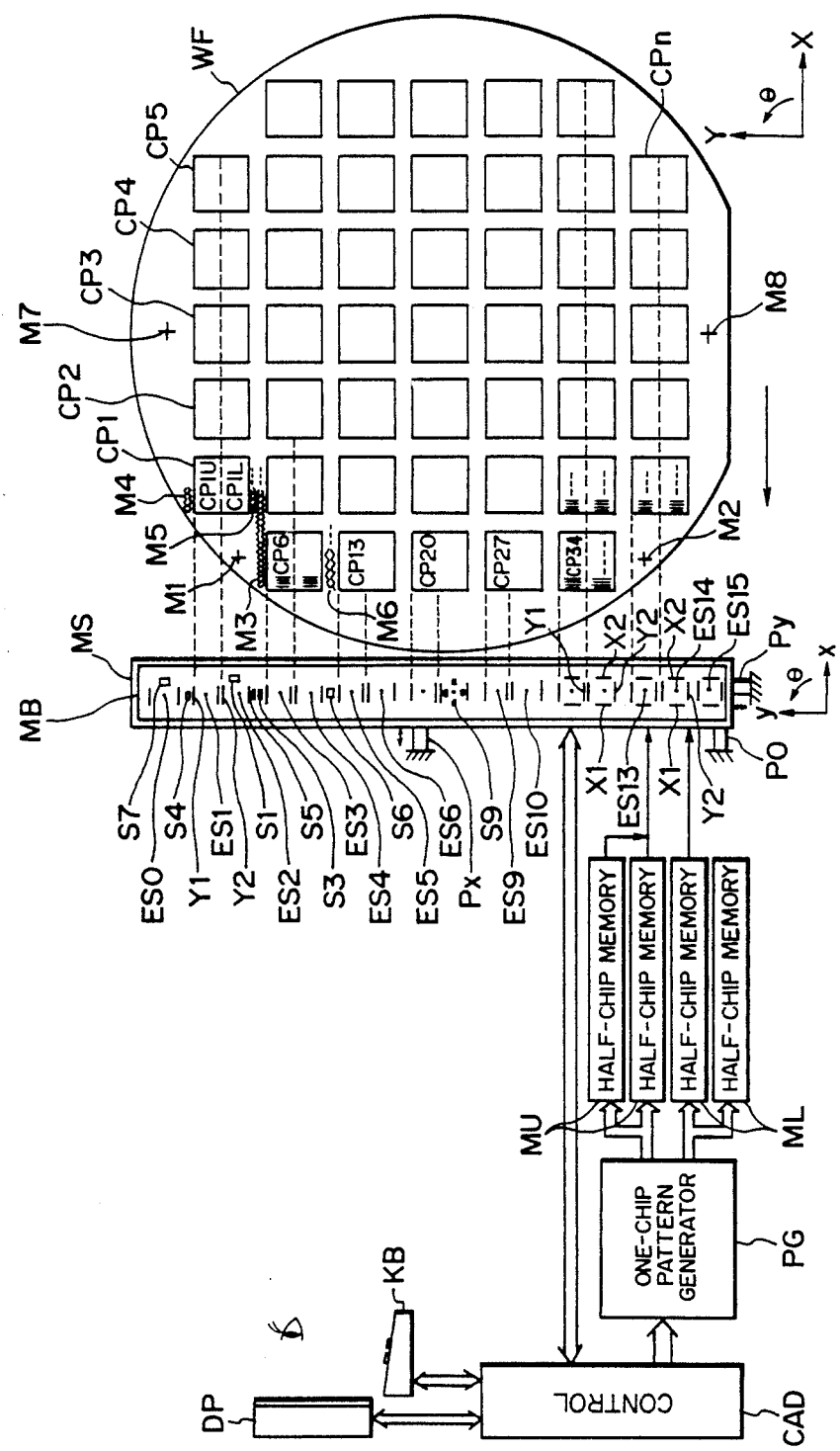
FIG. 1 is a schematic view of an electron beam apparatus according to a first embodiment of the present invention, wherein the electron beam apparatus is applied to the exposure of a semiconductor wafer.

Referring first to FIG. 1, there is schematically shown a multi-electron-beam pattern drawing apparatus according to a first embodiment of the present invention. In this embodiment, the invention is applied to a case when electron beams emitted from plural electron sources are deflected and scanned so that desired circuit patterns are drawn on different chips, respectively.

In FIG. 1, reference character WF denotes a wafer which is placed on an X-Y-$\theta$ stage (not shown) and which is formed of a semiconductor such as silicon, gallium or otherwise. The upper surface of the wafer WF is coated with a suitable resist material which has a sensitivity to the electron beam. Reference characters CP1-CPn denote plural different exposure regions, each corresponding to a portion of the wafer which is going to be formed into one chip as a result of the dicing to be made after completion of the pattern drawing. Reference characters M1-M8 denote prealignment marks or fine alignment marks, respectively, which are formed on the wafer WF. Electron beam producing head MB is mounted on a stage MS and supported thereby. The alignment marks M1-M8 are formed on the wafer during the first pattern drawing process and by use of the electron beams supplied from the electron beam head MB. The stage MS is provided with actuators such as, for example, piezoelectric devices Px, Py and P$\theta$, so that it is displaceable by a minute amount in each of the X, Y and $\theta$ (rotational) directions. The piezoelectric devices Px, Py and P$\theta$ can be used for the alignment of the electron beam head with the wafer WF.

Further, the electron beam head MB is provided with a plurality of electron beam producing sources ES0—ES15. In this embodiment, each electron beam producing source comprises such a source as having the structure and function which will be described later with reference to FIG. 2. Alternatively, each electron beam producing source may comprise an electron emitting element of the type, as described, wherein a cold cathode is used to emit electrons.

The electron beam producing sources ES0 and ES15 are provided to be exclusively used for the alignment. The electron beam producing sources ES1-ES14 are provided to be exclusively used for the exposure or, alternatively, they may be used also for the alignment purpose. In this embodiment, the exposing electron beam producing sources ES1-ES14 are used in pairs, each pair undertaking the pattern drawing with respect to each of the chips in one array extending in the X direction. For example, the upper half CP1U of the chip (exposure region) CP1 is subjected to the pattern drawing by means of the electron beam producing source ES1, while the lower half CP1L is subjected to the pattern drawing by means of the electron beam producing source ES2. Similarly, with regard to the exposure regions CP2-CP5, each upper half is subjected to the pattern drawing by use of the electron beam producing source ES1, while each lower half is subjected to the pattern drawing by use of the electron beam producing source ES2. Each of the electron beam producing sources ES0-ES15 is provided with deflecting electrodes X1, X2, Y1 and Y2 for deflecting the emitted electron beam in each of the X and Y directions. Further, there are provided sensors such as denoted at S1-S9. These sensors may be of the type having a sensitivity to light or to electrons.

Keyboard KB, display DP and controller CAD are usable to design a circuit pattern of one chip, the information concerning this being supplied to a one-chip pattern generator PG. In response, the pattern generator PG operates to divide the one-chip pattern drawing information into a plurality of pattern drawing information segments each related to a portion of one chip (e.g. the upper half or the lower half thereof), the divided pattern drawing information segments being supplied to half-chip memories MU and ML. These memories MU and ML are operable to supply, at the same time, the pattern drawing information to each of the electron beam producing sources ES1, ES3 and ES5-ES13 (each undertaking the pattern drawing with respect to the lower half of each chip) and to each of the electron beam producing sources ES2, ES4 and ES6–ES14 (each undertaking the pattern drawing with respect to the lower half of each chip). It should be noted that there are provided a pair of memories MU and a pair of memories ML. The paired memories may be used alternately, so that any loss in the time for the data transfer from the pattern generator PG can be avoided substantially. The design circuit pattern is divided into halves, in this embodiment. However, the circuit pattern may be divided into three or more portions. It is, of course, necessary to use memories of a number corresponding to the number of the divided portions.

In accordance with the pattern drawing information from the memory MU or ML, each electron beam producing source operates, with the aid of the deflection of an electron beam in the X direction by means of the associated X-direction deflecting electrodes X1 and X2, to effect the pattern drawing with respect to the X direction and within a range that can be covered by the electron beam deflection. At the same time, the wafer WF and the head MB are relatively and continuously moved in the Y direction, so that the pattern drawing with respect to all the picture elements in the Y direction included in each half region is accomplished. Since the movement in the Y direction is continuous, there occurs a shift in the Y direction each time the pattern drawing in the X direction is carried out for one picture element in the Y direction. The Y-direction deflecting electrodes Y1 and Y2 are used to compensate this. Additionally, while relatively and intermittently moving the wafer WF and the head MB in the X direction, the pattern drawing is repeatedly executed whereby the pattern drawing with regard to chips in one array extending in the Y direction is accomplished.

As described, the electron beam sources can operate to effect the pattern drawing, substantially simultaneously, with regard to the chips in one array (e.g. chips CP6, CP13, CP20, CP27 and CP34) of the wafer WF extending in the Y direction. Accordingly, high-speed pattern drawing is attainable.

The deflecting electrodes X1, X2, Y1 and Y2 can be used both for the initial adjustment of the axis of the electron beam and for the alignment of the electron beam with the wafer or the chip. For example, the positions of alignment marks M4 and M5 of the chip CP1 may be detected by the sensors S4 and S5 and, on the basis of the detected positional information, the deflecting electrodes X1, X2, Y1 and Y2 of each of the electron beam sources ES1 and ES2 may be actuated to change the position of irradiation of the electron beam upon the wafer. As for the chip alignment marks, one and the same mark (such as a mark M6) may be provided for two chips (such as chips CP6 and CP13).

As for the prealignment marks, on the other hand, there are provided marks such as denoted at M1, M2, M7 and M8. For example, the position of the mark M1 may be detected by the sensor S1, while the position of the mark M2 may be detected by another sensor (not shown). On the basis of the result of detection, the initial positional adjustment of the head MB may be carried out by means of the piezoelectric devices Px, Py and P$\theta$. Then, the chip alignment mark M3, the sensor S3 and otherwise are used to measure the positional deviation and, on the basis of the result of measurement, the electron beam irradiating position is corrected by use of the deflecting electrodes X1, X2, Y1 and Y2. After this is accomplished, the pattern drawing is started. In the course of the pattern drawing operation, the operation may be temporarily stopped and the alignment may be made again by use of marks M7 and M8.

The dimension of each chip on a wafer may be changed as a result of the change in shape of the wafer which might be caused by the temperature change, the heat treatment of the wafer or otherwise. If the size of the chip on the wafer changes, there occurs an error or difference between the actual chip size and the electron beam pattern drawing range within which the pattern drawing should be made in accordance with the preset circuit pattern data. If such an error or difference occurs, it is not possible to draw a desired circuit pattern correctly in each chip.

Such an inconvenience can be solved by the present invention. Namely, any change (the amount of change) in the size of each of the chips on the wafer, resulting from the change in shape of the wafer, can be determined by detecting the change in the coordinate system position of an alignment mark corresponding to that chip. More specifically, with regard to the Y direction, the sensors or detectors for detecting the alignment marks are always held in a fixed positional relationship, as shown in FIG. 1. Therefore, any change in the alignment mark position as assumed at the current exposure process as compared with that as assumed at the preceding exposure process, can be detected from the change in the relative position of the mark with regard to the corresponding detector.

With regard to the X direction, the error can be detected on the basis of any change in the interval between the alignment marks of adjacent chips in an array extending in the X direction.

A series of operations described above are made under the influence of the controller CAD shown in FIG. 1, the sequence being preparatorily stored as software into the controller CAD.

In accordance with the thus detected change in the size of each chip, the electron beam irradiating position on the wafer is corrected. More particularly, in consideration of the amount of change described above and the moving speed of the wafer WF, the axis of an electron beam emitted from a corresponding electron beam source is deflected by use of deflecting electrodes X1, X2, Y1 and Y2 so as to change the beam irradiating position.

The mark detection on these occasions is attainable in various ways. For example, the reflected electron detecting system or the secondary electron detecting system, both of which are well known in the art, may be used. Namely, an electron beam may be projected, e.g., from the electron beam source ES0 toward the mark M7, and reflected electrons and/or secondary electrons caused as a result of the electron beam irradiation may be detected by the sensor S7. By this, the position of the mark 7 can be detected. As for such a sensor 7, a p-n junction of a semiconductor, for example, is usable.

It should be noted that, in a case of mark detection using an electron beam, it is necessary to set the intensity of the electron beam and the time for the electron beam irradiation so as not to obstruct the mark reading.

If it is desired to detect plural marks at time, it is preferable to irradiate the marks with an electron beam at different timings so that these marks are detected at different timings. By doing so, the irradiation of a mark with an electron beam can be easily discriminated from the irradiation of another mark with an electron beam and, therefore, the plural marks can be detected by use of a single signal processing means.

Figure 2A:
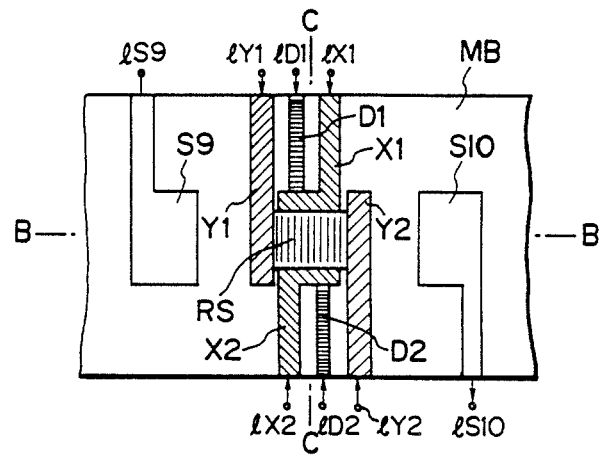
Figure 2B:
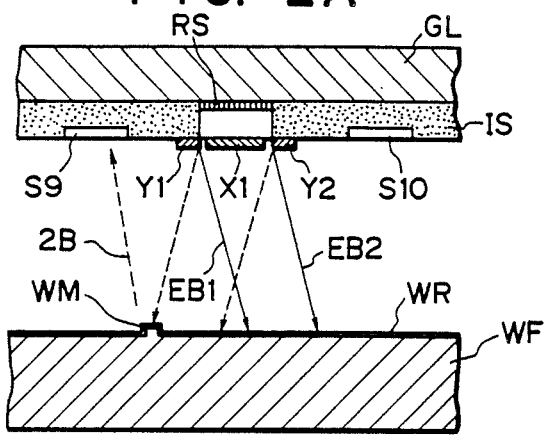
Figure 2C:
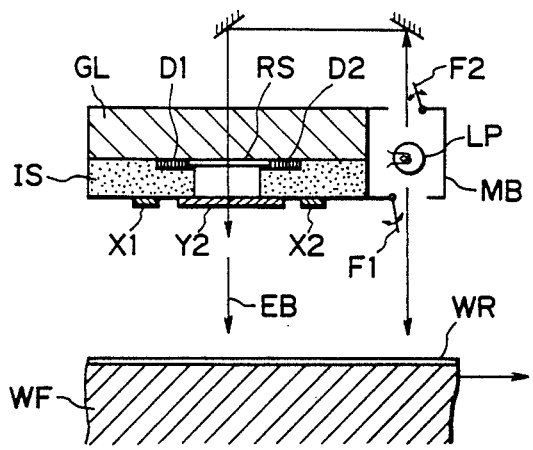

FIG. 2A is a fragmentary bottom view showing an example of an electron beam emitting head MB which is usable in the FIG. 1 embodiment. In FIG. 2A, one electron beam emitting source, namely one electron emitting element, is illustrated. FIGS. 2B and 2C are sectional views, respectively, taken on a line B—B and a line C—C in FIG. 2A, respectively.

In FIGS. 2A, 2B and 2C, reference character GL denotes an insulative base plate which is formed of, for example, glass, ceramics, crystal or otherwise. On the lower surface of the base plate GL, a number of electron beam emitting sources, each being of the surface conduction type, are provided and disposed in an array extending in the direction of the line B—B in FIG. 2A. Each electron beam emitting source includes a high-resistance thin film RS and electrodes D1 and D2 which are formed on the lower surface of the base plate GL. The high-resistance thin film RS can be formed, for example, by electrically energizing, under high temperature, a metal thin film such as Pt, Au, Mo, C, Pd or otherwise or a metallic oxide thin film such as $SnO_2$, $In_2O_3$, TiO or otherwise, to thereby cause breaking of the film structure. The thickness of the high-resistance thin film RS is, for example, of an order of 100–10000 Angstroms, and its resistance is, for example, of an order of several kiloohms to several hundred megaohms. As illustrated in the drawings, the electrodes D1 and D2 are connected to the opposite ends of the high-resistance thin film RS in the direction of the line C—C in FIG. 2A. Each of the electrodes D1 and D2 may comprise an ordinary thin film electrode made of, for example, a metal such as Pt, Au, Ag or otherwise.

On the lower surface of the base plate GL, there is formed an electrically insulating layer IS which is provided to cover the base plate GL as well as the electrodes D1 and D2, except for the portion below the high-resistance thin film RS. The insulating layer may be made of, for example, $SiO_2$, SiN, $Si_3N_4$, AlN, BN or otherwise. On the lower surface of the insulating layer IS, there are provided a pair of deflecting electrodes X1 and X2 and another pair of deflecting electrodes Y1 and Y2 which are extending in parallel to the direction of line B—B and the direction of line C—C with regard to the high-resistance thin film RS. Each of these deflecting electrodes may be made of a similar material as that of the electrode D1 or D2.

Denoted at S9 and S10 (FIG. 2B) are the photosensors or electron sensors as described hereinbefore. An additional pair of sensors may be provided in the Y direction. Alternatively, a plurality of sensors may be disposed in a ring-like fashion. In any case, the provision of sensors as a unit with an electron beam producing source assures that the sensors and the electron beam producing source are held in a fixed positional relationship, thus assuring improvements in the detection accuracy. Where photosensors are used, preferably an alignment light source LP may be incorporated into the head MB, as illustrated in FIG. 2C. When a solid state element such as a light emitting diode or otherwise is used as the lamp LP, it can be formed simultaneously with the formation of the electron beam source, the sensors and the like, by means of the semiconductor manufacturing technology or the thick/thin film manufacturing techniques.

When an ultraviolet light source or a deep UV light source is used as the light source LP, it can be used also for the excitation of a resist WR applied to the wafer WF surface. If the excitation is effected prior to the electron beam exposure, a thin unsolubility layer is formed on the surface of the resist WR, the unsolubility property of such a layer being increased as a result of the electron beam exposure. Accordingly, by doing so, it is possible to increase the ratio of the film thickness to the width of a line drawn on the wafer. As a result, the sensitivity or resolution (aspect ratio) can be improved. This is desirable. As for the resist WR material, a material "RD2000N" (trade name) manufactured by Hitachi Kasei Kogyo, Japan, for example, may be used. The provision of the light source LP within the structure of the head MB provides an advantage of allowing preparatory exposure at the time of relative movement of the head to the wafer WF.

Additionally, the light from the deep UV light source LP may be projected upon the thin film RS (electron emitting portion) at the time of exposure. By doing so, the number of emitted electrons increases. This is desirable. Further, when a light source providing a visible light is used as the light source LP, the formation of the thin film RS by use of a so-called photocathode material can provide substantially the same effects. As for such a photocathode material, various materials are usable. Examples are: a material comprising a compound of alkaline metal with Ag, Bi or Sb; a silver-cesium material; an antimony-cesium material; a bismuth-cesium material; a multi-alkaline material (a compound of alkaline metals), and so on.

Each electron beam producing source may be formed by a semiconductive member such as disclosed in U.S. Pat. No. 4,259,678 or Japanese Laid-Open Patent Application, Laid-Open No. Sho54-111272. Also, the light from the light source LP may be projected upon the thin film RS only when such a pattern as having a relatively wide linewidth is going to be drawn.

As described above, these electron beam producing sources can be easily provided on the base plate by means of the semiconductor manufacturing technology, and each electron beam producing source can be made compact.

Figure 3:
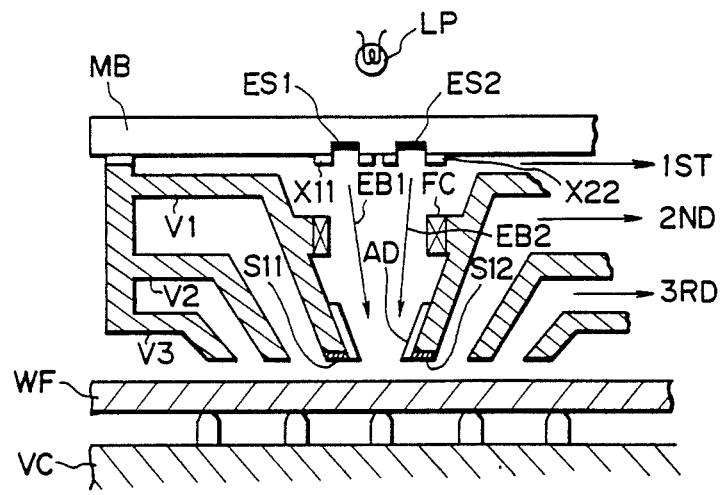
FIGS. 3 and 4 are fragmentary sections, respectively, schematically showing other forms of electron beam heads usable in the electron beam apparatus of the FIG. 1 embodiment.

FIG. 3 is a fragmentary view showing another example of an electron beam head which is usable in the electron beam pattern drawing apparatus of the FIG. 1 embodiment.

In the electron beam head of the FIG. 3 example, each pair of electron beam producing sources such as at ES1 and ES2, are provided as a "unit" beam producing source means.

Usually, an electron beam producing source means is disposed in a vacuum ambience in order to increase the electron emission efficiency and to prevent undesirable attenuation of the emitted electrons. In this example, the electron beam producing source means can be surrounded by a plurality of vacuum partition chambers so that it can be substantially isolated from the atmosphere surrounding it. With this arrangement, a large amount of electrons can be emitted only with a low-voltage drive. Also in this case, the additional light projection as described hereinbefore assures improved efficiency. Further, only a single electron beam source may be used to draw a line of a narrow width, while plural electron beam sources may be used to draw a line of a relatively wide width. This is effective to improve the pattern drawing speed.

Also, a focusing lens such as at FC and a deflecting electrode such as at AD may be provided.

In the structure shown in FIG. 3, a plurality of partition wall members such as at V1, V2 and V3 are used to define a plurality of partition chambers. Further, means may be provided to establish in these chambers, different degrees of vacuum, the degree of vacuum decreasing in an order from the first chamber to the third chamber. This arrangement is effective to isolate the electron beam producing means from the atmosphere, without making the structure large in size. Further, this allows use of a vacuum chuck VC for holding the wafer WF by vacuum attraction. In this example, sensors S11 and S12 may be mounted to the bottom surface of the partition wall member V1, for example.

Figure 4:
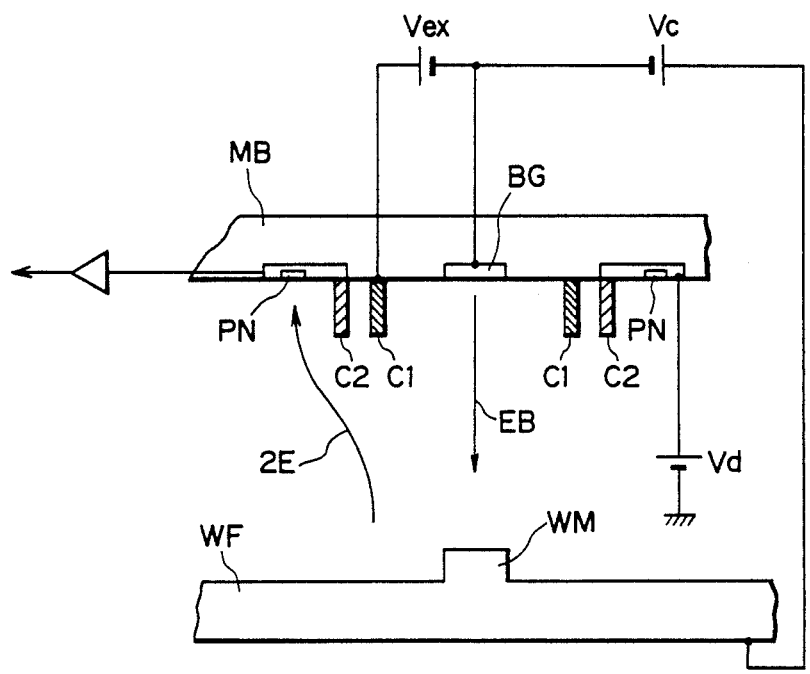

FIG. 4 is a fragmentary section showing another example of an electron beam emitting head usable in the FIG. 1 embodiment. In the FIG. 4 example, reference character BG denotes an electron beam emitting source of the type described hereinbefore. Also, as described in the foregoing, an electron beam EB is emitted from the source BG toward a wafer mark WM. As the wafer mark WM is irradiated with the electron beam EB, secondary electrons and/or reflected electrons as denoted at 2E in FIG. 1 are produced from the wafer WF. These secondary electrons or reflected electrons are received by one or more sensors PN, such as a p-n junction, for example, which are formed on the base member MB as a unit therewith. By this, the wafer mark WM is detected.

Preferably, the position of the sensor on the base member MB is such that the sensor can efficiently detect secondary electrons or reflected electrons 2e. Moreover, in the present embodiment, ring-like electrodes C1 and C2 are mounted on the base member MB side in order to further improve the efficiency of the electron detection. Additionally, an electric voltage Vex is applied between the electrode C1 and the electron beam producing source BG; an electric voltage Vd is applied to the electrode C2; and an electric voltage Vc is applied between the electron beam producing means BG and the wafer WF, as illustrated in FIG. 4.

Accordingly, when electric voltages (for example, Vex=10-100 V; Vc=1-10 KV; and Vd=100 V) are applied, secondary electrons or reflected electrons 2E are efficiently collected and detected by the p-n junction sensor PN.

Figure 5:
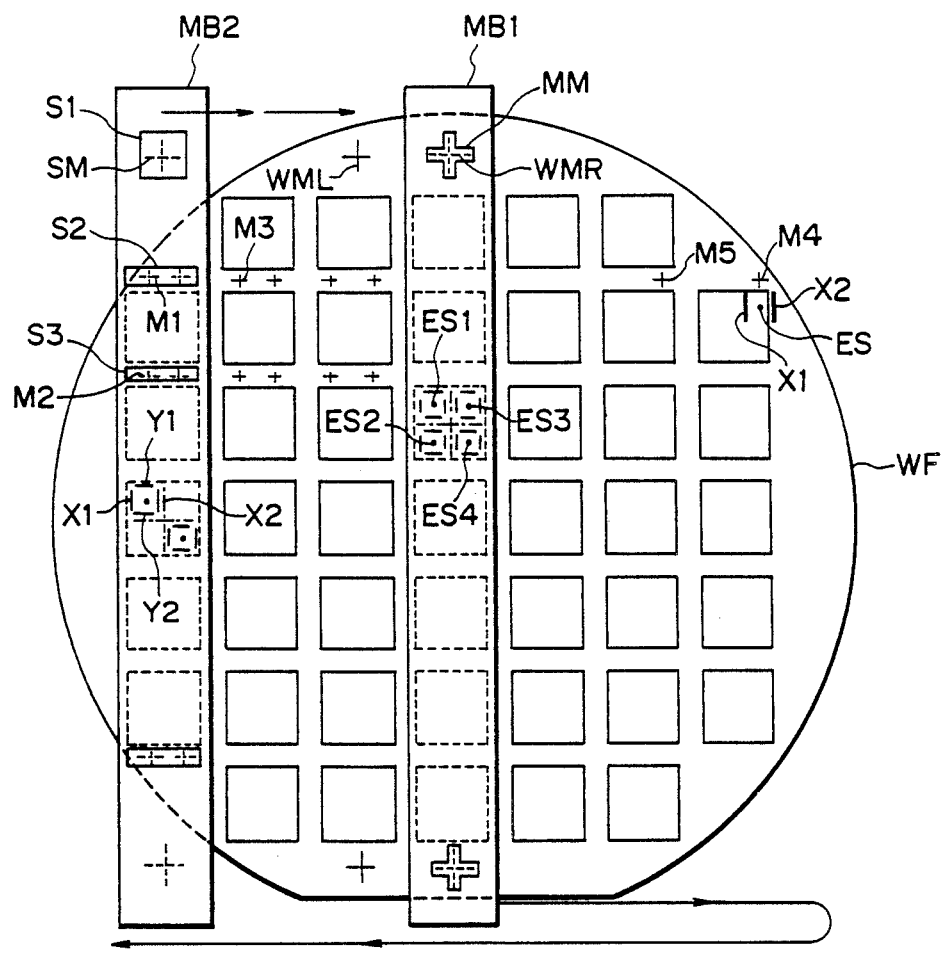
FIG. 5 is a schematic view of an electron beam apparatus according to a second embodiment of the present invention.

FIG. 5 shows an electron beam pattern drawing apparatus according to another embodiment of the present invention, which embodiment is a modified form of the FIG. 1 embodiment.

In FIG. 5, an electron beam head MB1 is provided with plural sets of electron beam sources, each set comprising four electron beam sources such as ES1-ES4 and corresponding to one chip. Each electron beam source is provided with X-Y deflecting electrode means, similar to that used in the FIG. 1 embodiment. Thus, in the present embodiment, patterns can be drawn on the four quadrant regions of each of the chips included in an array, at the same time and with the aid of the X-Y deflecting electrode means, in accordance with essentially the same principle as the FIG. 1 example. This ensures further improvement in the pattern drawing speed.

Further, the head MB1 is formed with alignment marks MM, these marks being aligned in a later stage with wafer alignment marks WMR, provided on the wafer, by use of light projection.

First, after completion of such alignment, patterns are drawn upon all the chips in the array extending in the Y direction and positioned at this time just below the head MB1. With regard to the chips of the other arrays, subsequently the head and the wafer are moved relatively and intermittently (step-by-step) and similar alignment operation and the pattern drawing operation are repeated.

Since, however, usually a wafer WF has a circular shape, it is possible that the wafer alignment marks WMR are not formed for each of the chip arrays in the Y direction. In such a case, first the electron beam head may be aligned with only one array at the central portion of the wafer and, once this is achieved, the succeeding exposures may be made without any feedback. Alternatively, the electron beam head may be aligned first by use of alignment marks WMR formed at the central portion of the wafer WF and, thereafter, the pattern drawing (exposure) is made in the sequence from the left to the right in FIG. 5. At the time when the exposures of the right half of the wafer are completed, the electron beam head may be reversed leftwardly and, after completing again the alignment using the marks WMR again or using alignment marks WML formed at portions of the wafer which are unexposed, the exposures to the remaining portions of the left half of the wafer may be made.

Only for explanation of another alignment and exposure method which can be used in the present embodiment, another electron beam head is additionally illustrated in FIG. 5 as denoted by reference character MB2.

In this case, the head MB2 is initially positioned at the leftward end portion of the wafer WF. First, a mark SM provided on a wafer stage is detected by use of a sensor S1 and, on the basis of which, the prealignment is carried out. Subsequently, in the prealigned state, marks M1 and M2 and sensors S2 and S3 are used to measure the amount of positional deviation. Then, at the time of exposure, the electron beam irradiation is effected with the compensation of the detected positional deviation by using both or one of the X and Y deflecting electrodes. For the next array, first, marks M3 are used in a similar manner and any positional deviation is measured. On the basis of the result of measurement, exposures are made. For the subsequent array, similarly, the measurement of positional deviation and exposures are made. However, before conducting the measurement and the exposure, marks WML may be used to effect again the prealignment.

It is possible that a mark M4 is used for measurement of the positional deviation of the electron beam head positioned to be opposed to the array having the mark M4; in that position, the head operates to effect exposures of those regions which are being covered by the electron beam sources ES and the deflecting electrodes X1 and X2; thereafter, while continuously moving the head or the wafer, the exposure is effected; after the exposure of the chips on that array are completed, the head or the wafer is stopped at the mark M5 position; and then the above-described operations are repeated. This corresponds to an intermediate of the step-and-repeat exposure and the step-and-scan exposure.

FIGS. 6A, 6B, 6C and 6D show further embodiments of the present invention which correspond to modified forms of the apparatus of the FIG. 1 embodiment, respectively. FIG. 6A shows an example wherein there are provided plural electron beam heads MB1 and MB2 which are adapted to undertake the pattern drawing to the left half and the right half of a wafer WF, respectively. This arrangement permits further improvement of the throughput.

FIG. 6B shows an example wherein smaller-diameter wafers WF1 and WF2 are subjected at once to the exposure using a single electron beam head MB. Also in this example, the throughput can be improved significantly.

FIG. 6C shows an example wherein a plurality of electron beam heads MB1, MB2 and MB3, each having a short length are disposed along the Y direction. This example can suitably meet a case when the manufacture of a long head is difficult or to a case when a large-diameter wafer having a diameter not less than 8 inches is to be used. As described hereinbefore, usually the end portion of an electron beam head is provided with an alignment mark detecting portion or it is provided with a reinforcing structure. Accordingly, in this example, the plural electron beam heads MB1-MB3 should preferably be disposed in a staggered relation as illustrated.

FIG. 6D shows an example wherein a plurality of electron beam sources are formed on a single head MB and wherein these electron beam sources are arranged to emit electron beams of different beam diameters. More specifically, the electron beam sources ES1 and ES2 have a large size diameter; the electron beam sources ES3 and ES4 have a middle-size diameter; and the electron beam sources ES5-ES8 . . . have a small-size diameter. Usually, first, the electron beam sources ES5-ES8 . . . are used so that pattern portions except for those portions having a middle linewidth and a wide linewidth, are drawn on the wafer. Thereafter, by using the electron beam sources ES4, ES2 or otherwise, the pattern portions having a middle linewidth or a wide linewidth are drawn on the wafer. At this time, the head or the wafer is moved to allow that the pattern portions having a line width corresponding to the used electron beam source are drawn on each chip.

Figure 7:
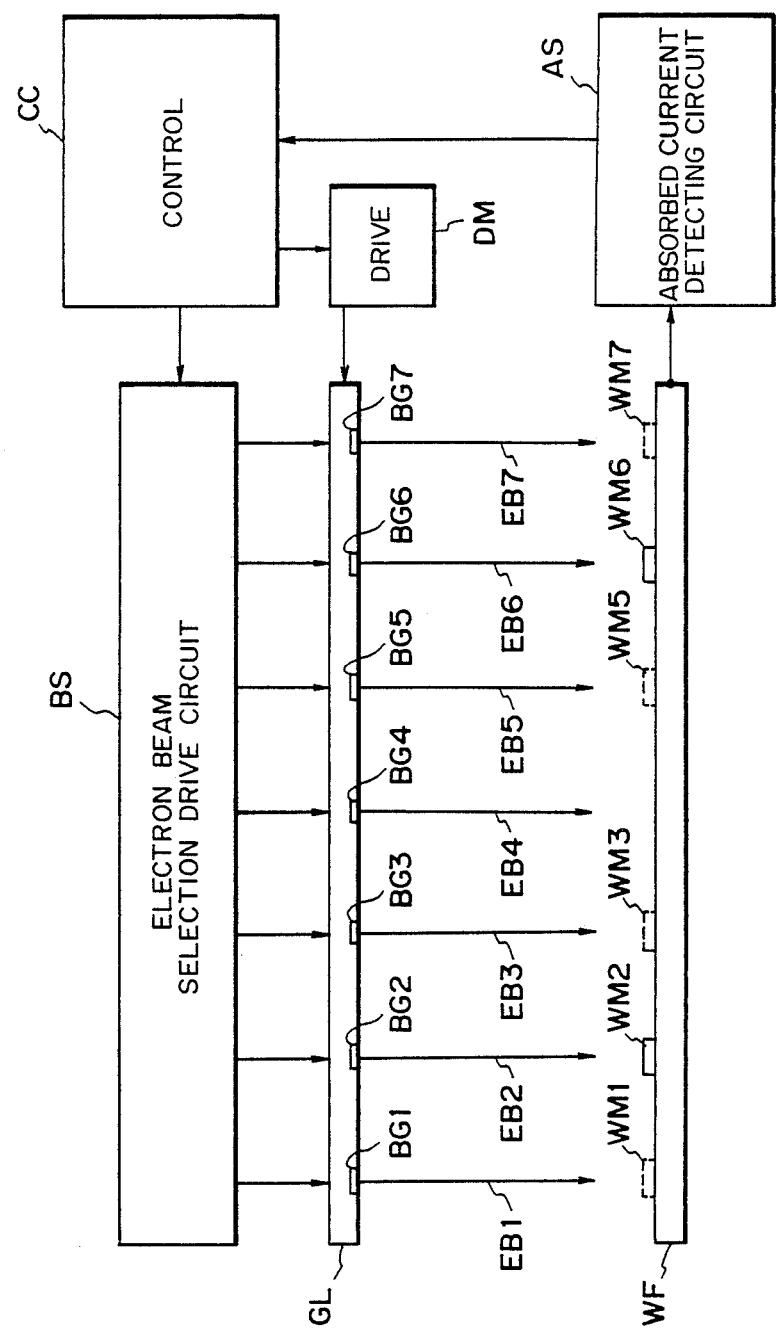
FIG. 7 is a schematic and diagrammatic view for explaining selective use of electron beam sources in a case when an electron beam head of the type as employed in the FIG. 1 embodiment, for example, is used.

FIG. 7 is a schematic view for explaining the selective use of electron beam sources, according to another aspect of the present invention. The electron beam emitting head shown in FIG. 7 is so arranged that a wafer mark is not detected by a sensor provided on the head side, but is detected on the basis of the magnitude of an electric current as absorbed by a wafer WF.

In FIG. 7, reference character WF denotes a wafer which contains a semiconductive material. A plurality of electron beam producing sources BG1-BG7 adapted to produce electron beams EB1-EB7 are formed on a single and common base plate GL, which may be made of a glass material, a semiconductive material or otherwise such as disclosed, for example, in Japanese Laid-Open Patent Applications, Laid-Open Nos. Sho54-111272 and Sho56-15529. Additionally, there are provided a selection and driving circuit BS which is provided to selectively drive the electron beam producing sources BG1-BG7; a controller CC provided to control the apparatus as a whole; and an absorbed current detecting circuit AS adapted to detect the absorbed electric current which is caused as a result of the irradiation of an electron beam detecting an alignment mark on the wafer WF. The alignment mark can be detected by scanning the mark on the wafer with an electron beam and by detecting any change in the absorbed electric current, which change is caused with the change in the surface configuration at the mark portion of the wafer. An electron lens means, a deflecting electrode or a blanking electrode, having been described with reference to FIGS. 2 and 3, may be provided if necessary.

In the described structure, if alignment marks are provided on the wafer WF at the positions as denoted by solid lines WM2 and WM6, respectively, the actual circuit device pattern should locate in the inside region between these marks WM2 and MW6. Accordingly, in such a case, the electron beams EB3, EB4 and EB5 are selected for the drawing of the actual circuit device pattern, while the electron beams EB2 and EB6 are selected for the detection of the alignment marks. The selection is made at the selecting circuit BS. The selection is made in accordance with preset data which is determined on the basis of the positional relationship between the base plate GL and the wafer WF, the data being stored in the controller CC. The selected electron beam producing sources are selectively controlled for the alignment purpose and the pattern drawing purpose, respectively, by means of the selection and driving circuit BS and the controller CC.

In operation, the electron beams EB2 and EB6 are emitted toward the marks, whereby electrons are absorbed by the wafer WF. The magnitude of the absorbed electric current is detected by the current detecting circuit AS, whereby the positions of the marks WM2 and WM6 can be determined. It should be noted however that, as described in the foregoing, it is desirable to produce the electron beams EB2 and EB6 at different timings so that the mark detection signals can be discriminated from each other. On the basis of the mark detection, the wafer WF is aligned with the aid of the driving portion DM. Thereafter, the electron beams EB3-EB5 are used to draw the circuit pattern in the manner as has been described with reference to FIG. 1 or 5.

If, on the other hand, the alignment marks are at the positions shown by broken lines WM3 and WM5, the electron beams EB3 and EB5 are used for the alignment purpose, while the electron beam EB4 and/or the electron beams EB1, EB2, EB6 and EB7 are used for the exposure purpose. Also, if the alignment marks are at positions shown by broken lines WM1 and WM7, the electron beams EB1 and EB7 are used for the alignment, while the electron beams EB2-EB6 are used for the exposure. However, it is to be noted that the electron beam sources can be selected somewhat freely. For example, while in the present embodiment the electron beam source BG6 is selected as an alignment scope beam irradiating source when the alignment mark WM6 is used, the selection of the source BG6 is not limitative. Namely, an adjacent electron beam source BG5 or BG7 may be selected.

In the foregoing embodiments, the present invention has been described in an aspect of a pattern drawing method wherein a pattern is drawn on each chip on a wafer by scanning and ON-OFF controlling an electron beam while deflecting the same by use of deflecting means. Next, description will be made of another aspect of the present invention, according to which the present invention is applied to another pattern drawing method which is different from that in the foregoing embodiments.

Figure 8:
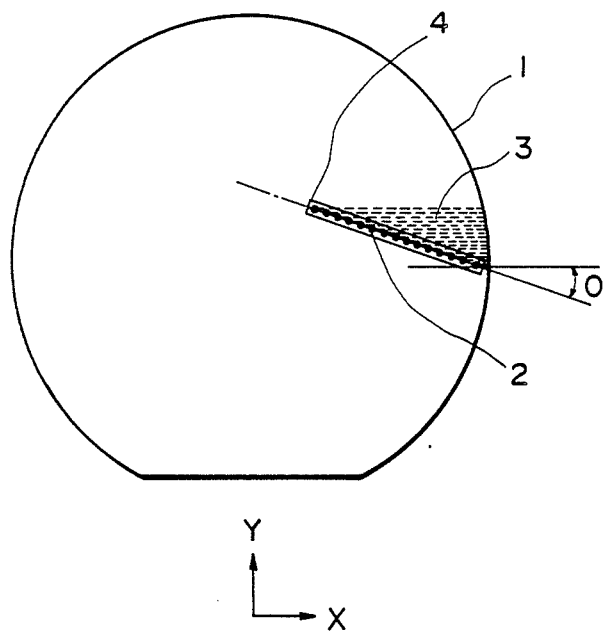
Figure 9:
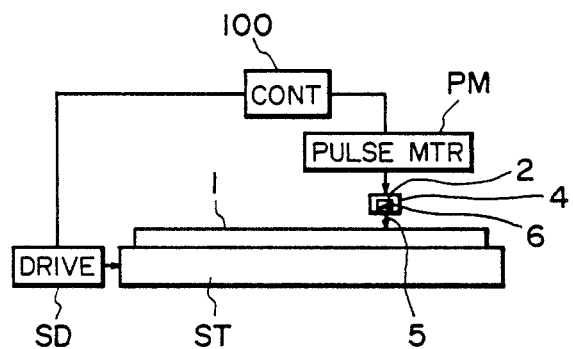

Referring now to FIGS. 8 and 9, there is shown an electron beam pattern drawing apparatus according to a seventh embodiment of the present invention. In these Figures, denoted at 1 is a wafer; at 2, an electron source means comprising a plurality of electron sources arrayed one-dimensionally to provide an array of electron sources; and 4, an electron beam head comprising the electron source means 2. While not shown in these Figures, each electron source is provided with deflecting means and detecting means, as has been described with reference to the FIG. 1 embodiment. Thus, the electron beam head 4 of the present embodiment has a similar structure as that of the FIG. 1 embodiment. However, in this embodiment, the electron sources of the present embodiment should preferably be disposed more densely in the one-dimensional direction. The multi-chamber structure shown in FIG. 3, for forming a vacuum ambience for the electron beam sources, may be similarly adopted. Also, the detection of secondary electrons and/or reflected electrons and the selective use of plural electron beam sources, as has been described with reference to FIG. 7, may be adopted similarly.

Accordingly, description will be made to the operation of the electron beam pattern drawing apparatus of the present embodiment, when it is used in accordance with a pattern drawing method which is different from that used in the foregoing embodiments.

After completion of the alignment made in a similar manner as has been described with reference to the first embodiment, a controller 100 (which corresponds to the controller CAD in FIG. 1) operates to actuate a pulse motor PM (which will be described later) to cause it to move the head 4 so that the head 4 is inclined by a predetermined angle $\theta$ with respect to the X direction. The angle $\theta$ is determined preparatorily in accordance with an equation "$\theta_M = \sin^{-1}(d/kD)$" wherein $k > 1$, the equation being provided to determine a reference value, as will be described later in more detail. The angle $\theta$ is stored in the controller 100.

In order to draw a pattern 3 on a wafer 1, the wafer 1 is moved at a constant speed in the X-axis direction. At this time, the electron beam head 4, namely the electron source means 2 is disposed so that the direction of one-dimensional array of the electron sources of the electron source means 2 defines an angle $\theta$ with respect to the X-axis direction, namely the moving direction of the wafer 1. Where the width of each electron emitting portion of the electron source means 2 is denoted by d and the interval between the electron sources is denoted by D, then the angle $\theta$ can be expressed as follows:

$$\theta = \sin^{-1}(d/D) \qquad (1)$$

However, in consideration of the possibility of corrected pattern-drawing described later, the angle is determined in accordance with the following equation:

$$\theta_M = \sin^{-1}(d/kD) \qquad$$

wherein $k > 1$.

While moving the wafer 1 in the described manner, electrons are emitted from the electron sources at desired timings, whereby a pattern such as shown in FIG. 3 is formed. The electron emission timing can be determined in the manner described hereinbefore.

In the side view of FIG. 9, showing the positional relation between the electron source means 2 and the wafer 1, reference numeral 6 denotes an electron emitting portion; a reference numeral 5 denotes electrons emitted from the electron emitting portion; reference character ST denotes a wafer stage; a reference character SD denotes a wafer stage driver.

Since, as best seen in FIG. 9, the head 4 is disposed close to or in close proximity to the wafer 1, each picture element of the pattern 3 formed in the described manner on the wafer 1 has substantially the same size as of each electron emitting portion 6. Further, the electron source means is disposed to satisfy the equation (1') which will be set forth later. Accordingly, there is formed no spacing between a line as drawn by one electron source and a line as drawn by an adjacent or next electron source. The angle $\theta$ defined between the moving direction of the wafer 1 and the direction of the one-dimensional array of the electron sources of the electron source means 2 is determined in accordance with the equation (1') set forth later.

The angle $\theta$ is measured by use of a rotary encoder and, on the basis of the information concerning the result of measurement, the controller CPU (100) controls the pulse motor PM which is provided above the electron source means, so that the electron source means is rotationally moved by a predetermined angle with the actuation of the pulse motor PM. By this, the electron beam head 4 is set in its correct angular position.

The CPU 100 also functions to control the movement of the wafer stage ST by way of the stage driver SD.

As described with reference to some of the foregoing embodiments, the change in shape of a wafer which results from the change in temperature, the heat treatment or other processings, causes an error in the pattern drawing magnification. The present embodiment also allows correction of such an error of the pattern drawing magnification (range) according to a preset circuit pattern data.

Any change in the size of each chip, namely any change in the position thereof with respect to the X-Y coordinate system, can be detected in the manner as described with reference to the FIG. 1 embodiment. In accordance with the detected change in the position with respect to the X-Y coordinate system, inclination $\theta$ of the electron source array 2 shown in FIG. 8, for example, or the timing of electron emission from the electron source means 2 is adjusted, by which the magnification can be corrected. Details of the manner of adjustment will be described below.

The component in the Y-axis direction in FIG. 8, namely the component in the direction perpendicular to the moving direction of the wafer 1, can be corrected by minutely adjusting the angle $\theta$ which the direction of array of the electron sources forms with respect to the X axis.

Figure 14A:
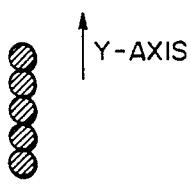
FIGS. 14A, 14B, 14C and 14D are schematic views, respectively, for explaining the principle of correction of the pattern drawing in the apparatus of the FIG. 8 embodiment.
Figure 14B:
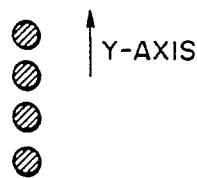

If the angle $\theta$ is expressed by:

$$\theta = \sin^{-1}(d/D)$$

as in equation (1) set forth hereinbefore, the pattern which can be drawn by the electron beams is such as shown in FIG. 14A. It is seen therefrom that, if the angle of inclination is larger than the angle $\theta$, the formed dots are separated as shown in FIG. 14B. Accordingly, in order to avoid this, the angle $\theta$ should be set at a value (reference value) which is not greater than "$\sin^{-1}(d/D)$".

For example, it is now assumed that, as the reference angle $\theta$, such an angle $\theta_M$ that is given by the following equation is used:

$$\theta_M = \sin^{-1}(d/kD) \qquad (1')$$

wherein $k > 1$.
Since the interval between dots in this case is $d/k$, if the angle $\theta$ is changed from $\theta_M$ to $\theta_L$, wherein $$\theta_L = \sin^{-1}(d/D),$$

then the dot interval increases to "d". Thus, without separation of dots, the dot interval can be enlarged by k-times larger. Also, as the angle $\theta$, an angle $\theta_S$ wherein $$\theta_S = \sin^{-1}(d/k'D)$$

wherein $k' > k > 1$, is used, the dot interval can be reduced at the ratio of k/k'.

On the other hand, the correction of the component in the X-axis direction which is the moving direction of the wafer 1, is made by minutely adjusting the timing of electron emission from each electron source and/or the moving speed v of the wafer 1, preferably while taking into account the error due to the minute adjustment of the angle $\theta$.

Figure 14C:
Figure 14D:
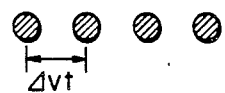

In this case, as in the case of the component in the Y-axis direction, the dots can be formed so as to contact with each other such as shown in FIG. 14C, if the clockpulse t=d/v. If the pattern drawing speed is increased from "v" to "v+$\Delta$v" while retaining such a clockpulse, the formed dots are separated as shown in FIG. 14D. Thus, a continuous line cannot be drawn. In consideration of this, as a reference clock, such a value $t_M$ which is given by the following equation is selected:

$$t_M = d/kv$$

wherein $k > 1$.

By using such a clock $t_M$, the dot interval becomes equal to "d/k". Thus, by retarding the clock by multiplying the same by "k", for example, or by retarding the wafer moving speed v by multiplying the same by "1/k", the dot interval can be increased by k-times larger in the X-axis direction without separation of dots. Also, if the clock is accelerated with respect to the reference value $t_M$ by multiplying the former by "k/k'" or if the wafer moving speed is accelerated by multiplying the same by "k'/k" so that $$P_S = d/k'v,$$

wherein $k' > k > 1$, then the dot interval can be reduced at the ratio of k/k'. Thus, by adjusting the array of electron sources and/or the timing of electron emission from the electron sources, in the manner described above, any change in the shape of the wafer in the X and Y directions can be sufficiently compensated.

Figure 10A:
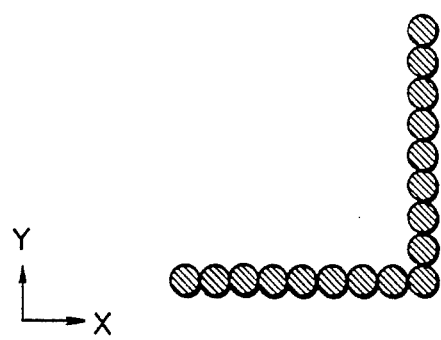
FIGS. 10A and 10B are schematic views, respectively, showing examples of patterns that can be drawn on a wafer by use of electron source devices shown in FIGS. 11 and 12, respectively.
Figure 10B:
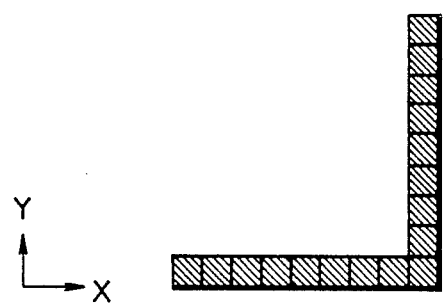
Figure 11:
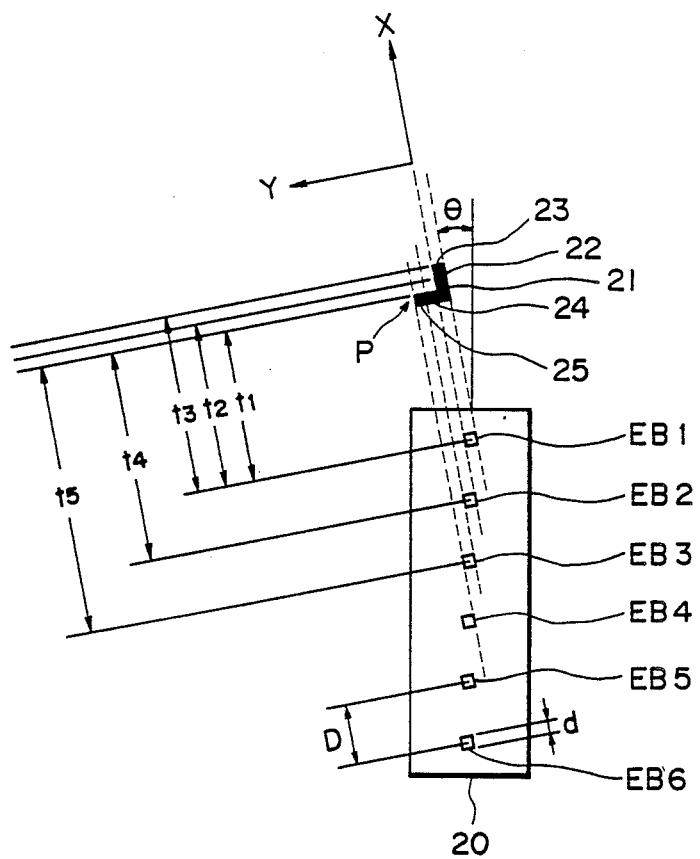
FIG. 11 is a schematic view showing a modified form of an electron beam head usable in the FIG. 8 embodiment, the arrangement and configuration of the electron emitting portions thereof and the manner of pattern drawing using the electron beam head.

Referring now to FIGS. 10A, 10B and 11, description will be made of an electron beam pattern drawing apparatus according to a further embodiment of the present invention.

When each electron emitting portion 6 (FIG. 9) has a circular shape and the array of electron sources disposed one-dimensionally is inclined by an angle $\theta$ with respect to the moving direction X of the wafer, as shown in FIG. 8, and if the pattern drawing is made so that the dots formed on the wafer by means of the electron sources do not overlap one another, the pattern formed on the wafer 1 and comprising a line parallel to the X axis and a line parallel to the Y axis is such as shown in FIG. 10A. Thus, a rectilinear pattern cannot be drawn. Such a problem can be solved by the present embodiment, and a rectilinear pattern, such as depicted in FIG. 10, can be drawn by the present embodiment.

The arrangement of electron sources disposed unidirectionally for assuring this, is illustrated in FIG. 11. In this Figure, an electron emitting head 20 is provided with a plurality of electron sources having electron emitting portions EB1–EB6, respectively. As shown in this Figure, each electron emitting portion has a square shape.

The X-Y coordinate system shown in FIG. 11 corresponds to the coordinate system of the wafer 1 shown in FIG. 8. Also in this example, the direction along which the electron sources are arrayed unidirectionally is inclined by an angle $\theta$ with respect to the wafer moving direction (X-axis direction). The value of the angle $\theta$ is given similarly in accordance with the equation (1) set forth hereinbefore. However, as will be seen from FIG. 11, each electron emitting portion has a square shape wherein one side is parallel to the wafer moving direction (X-axis direction). The remaining portion of the structure and the operation of the present embodiment are similar to those of the embodiment described with reference to FIGS. 8 and 9.

Particularly, however, description will be made of the manner of drawing a pattern P comprising picture elements 21–25, as shown in FIG. 11.

First, after completion of the alignment between the electron beam head and the wafer, the wafer is moved at a constant speed v in the negative X-axis direction. It is now assumed that the time at which a wafer surface position corresponding to the picture element 21 comes just underneath the electron emitting portion EB1 is denoted by t1; the time at which a wafer surface portion corresponding to the picture element 22 comes just underneath the electron emitting portion EB1 is denoted by t2; the time at which a wafer surface portion corresponding to the picture element 23 comes just underneath the electron emitting portion EB1 is denoted by t3; the time at which a wafer surface portion corresponding to the picture element 24 comes just underneath the electron emitting portion EB2 is denoted by t4; and the time at which a wafer surface portion corresponding to the picture element 25 comes just underneath the electron emitting portion EB3 is denoted by t5. Then, by controlling the electron emission so that electrons are emitted from the electron emitting portion EB1 at times t1, t2 and t3; that electrons are emitted from the electron emitting portion EB2 at the time t4; and that electrons are emitted from the electron emitting portion EB3 at the time t5, then the pattern P as depicted in FIG. 11 can be drawn on the wafer.

In this case, each electron emitting portion has a square shape and is disposed so that one side of the square shape is parallel to the moving direction of the wafer. Accordingly, a rectilinear pattern comprising portions in parallel to the X and Y directions can be drawn.

Description will be made of another embodiment of the present invention, by using FIG. 11 again. In the example described just above, electrons are emitted from electron sources at times t1–t5. In the present embodiment, a similar arrangement is used. However, in the present embodiment, the shortest one of the intervals of these timings is used as a clockpulse and, by using such a clockpulse, the electron emission time for each electron source is counted.

It is now assumed that the moving speed of the wafer is v; the size of each of the electron emitting portions is d; and the interval between two adjacent electron emitting portions is D. Then, the shortest timing $t_{min}$ can be given by the following equation:

$$t_{min} = d/kv \quad (2)$$

wherein $k \geq 1$

The ordinary timing $t_i$ can be given by the following equation:

$$t_1 = (md + nD')/kv \quad (3)$$

wherein m and n = 0, 1, 2, 3, . . .

$$D' = \sqrt{D^2 - (d/k)^2}$$

In order to count the ordinary timing $t_i$ while using $t_{min}$ in equation (2) as the clockpulse, it is necessary that $t_1/t_{min}$ is an integral number. Namely, since $$t_1/t_{min} = m + n\sqrt{(D/d)^2 - (1/k)^2} \quad (4)$$

Then if $$\sqrt{(D/d)^2 - (1/k)^2}$$

is an integral number, the value obtainable from equation (4) is always an integral number. Thus, if $$\sqrt{(D/d)^2 - (1/k)^2} = l$$

wherein l is an integral number and if the interval D between the electron emitting portions is set so that:

$$D = d\sqrt{l^2 + (1/k)^2}$$

then it is possible to count the ordinary timing $t_i$ by using the shortest timing $t_{min}$ as a clockpulse.

In other words, by employing an electron source structure in which the interval between the electron emitting portions satisfies the above-described relation, the manner of driving the electron sources can be simplified.

Figure 12:
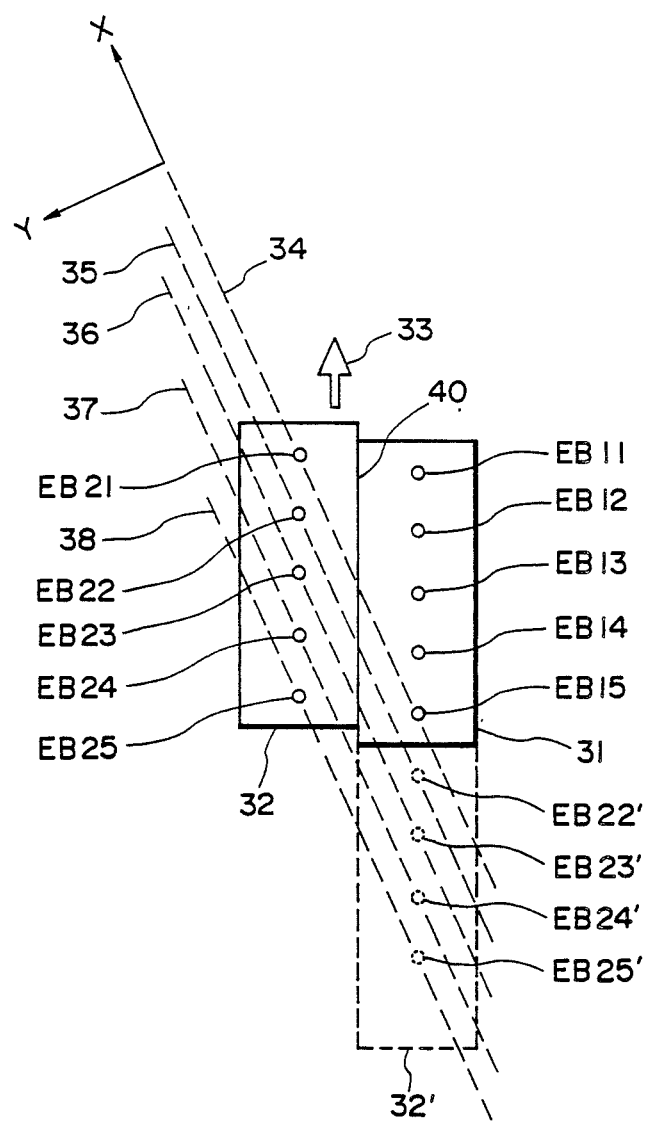
FIG. 12 is a schematic view showing a further form of an electron beam head usable in the FIG. 8 embodiment, and for explaining the manner of pattern drawing by use of the electron beam head.

Referring now to FIG. 12, description will be made of an electron beam pattern drawing apparatus according to a further embodiment of the present invention. In the apparatus of the FIG. 12 embodiment, at least two electron source units, each having a plurality of electron sources are arrayed one-dimensionally. In FIG. 12, reference numeral 31 denotes an array of electron sources (electron source unit) wherein a plurality of electron sources are disposed unidirectionally, as in the FIG. 11 embodiment. Reference numeral 32 denotes another electron source unit having the same structure.

Upon pattern drawing, the wafer is moved in the X-axis direction, as in the case of the foregoing embodiment. The electron source arrays 31 and 32 are preparatorily disposed so that they can draw patterns 35, 36, 37 and 38, which could be drawn if electron emitting portions EB22', EB23', EB24' and EB25' having the same pitch as of the electron emitting portions EB11–EB15 of the electron source array 31 are disposed, as an array 32', in series to the electron emitting portions of the electron source array 31.

In this particular example, the electron source arrays 31 and 32 are so set that the line as drawn by the electron emitting portion EB15 of the electron source array 31 and the line as can be drawn by the electron emitting portion 21 of the electron source array 32 overlap upon one another, as seen from the pattern 34 depicted in FIG. 12. The abutting surfaces (shown at 40) of the electron source arrays 31 and 32 is parallel to the direction of uni-directional, array of the electron emitting portions. Therefore, in order to set these electron source arrays in the manner described above, it is only necessary to relatively shift the electron source array 32 in parallel to the abutting surface 40, as depicted by an arrow 33 in FIG. 12. Disposing the electron source arrays 31 and 32 in the described manner allows the electron source array 32 to draw a line that could be drawn if the electron source array 31 is extended or enlarged uni-directionally to provide an extension (electron source array 32'). In other words, the electron emitting portions EB22–EB25 of the electron source array 32 correspond to the electron emitting portions EB22'–EB25' of the electron source array 32', respectively. Since, as described, the electron emitting portions EB15 and EB21 are disposed so as to draw the same line, a line as drawn by the electron source array 31 can be exactly connected to a line as drawn by the electron source array 32.

The described arrangement of the electron source means is effective to reduce the number of electron sources included in one unit (the array 31 or 32). Thus, the yield of such a unit can be improved. Additionally, even if one electron emitting portion is broken, it is not necessary to replace the hole electron source means. It is necessary to replace only such a unit having a disordered electron emitting portion.

Figure 13:
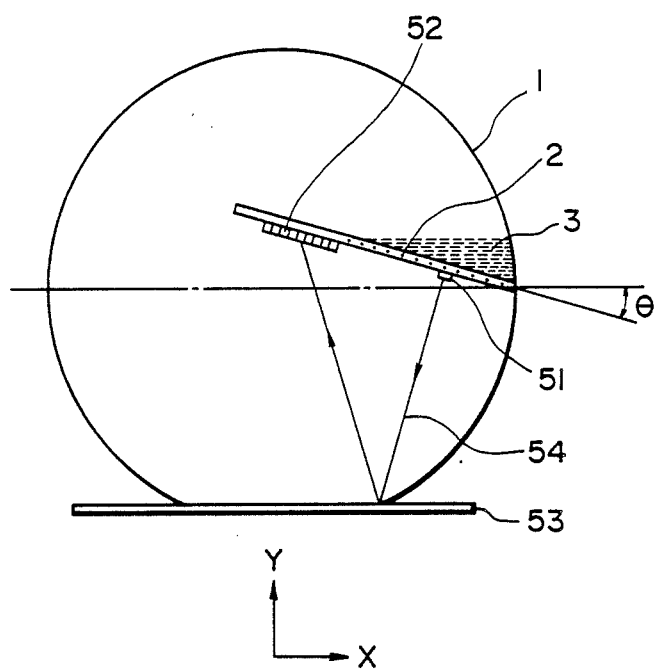
FIG. 13 is a schematic top plan view for explaining the manner of monitoring the inclination of an electron source array with respect to a wafer, in an electron beam pattern drawing apparatus according to a further embodiment of the present invention.

Referring now to FIG. 13, description will be made of an electron beam pattern drawing apparatus according to a still further embodiment of the present invention.

In this embodiment, the electron beam pattern drawing apparatus is arranged so that the inclination angle θ of an electron source array with respect to the moving direction of a wafer can be monitored, without use of a rotary encoder. In some embodiments described hereinbefore, the inclination angle θ is measured by use of a rotary encoder. However, in this embodiment, as shown in FIG. 13, an electron source unit in which a plurality of electron sources 2 are arrayed uni-directionally, is provided with a semiconductor laser 51 and a line sensor 52. The semiconductor laser 51 has a collimator lens disposed therein. A laser beam 54 emitted from the laser unit 51 is projected upon a mirror 53 having a reflection surface disposed in parallel to a reference surface which depicts the orientation of the wafer 1. The laser beam 54 reflected by the mirror 53 is incident upon the line sensor 52. The line sensor 52 produces a signal which is supplied to a central processing unit (not shown), whereby the angle θ can be determined on the basis of the position of the reflected light from the mirror 53 upon the line sensor 52. As for the reference surface depicting the orientation of the wafer 1, an orientation flat of the wafer or otherwise may be used.

In accordance with the concept of the present embodiment, described above, the orientation of the electron source array as assumed when the wafer is being moved can be monitored. Thus, the real-time monitoring is attainable.

While the invention has been described with reference to the structures disclosed herein, it is not confined to the details set forth and this application is intended to cover such modifications or changes as may come within the purposes of the improvements or the scope of the following claims.

What is claimed is:

1. A charged-particle beam apparatus for drawing a pattern on a workpiece having a radiation sensitive material, said apparatus comprising:
   a plurality of charged-particle beam sources provided on a common base member; and
   controlling means for selectively controlling said charged-particle beam sources so that at least one of said charged-particle beam sources is used only for pattern drawing while at least one other charged-particle beam source is used only for alignment of said charged-particle sources and a region of the workpiece in which the pattern is to be drawn.

2. An apparatus according to claim 1, wherein each of said charged-particle beam sources comprises an electron emitting element of a type wherein emission of electrons from a cold cathode is used.

3. An apparatus according to claim 1, further comprising means for detecting at least one of secondary electrons and reflected electrons produced by impingement of a charged-particle beam to the workpiece, wherein the alignment is made on the basis of the detection by said detecting means.

4. An apparatus according to claim 3, wherein at least two of said charged-particle beam sources are controlled by said controlling means only for the alignment, and wherein said at least two charged-particle beam sources are controlled so as to produce charged-particle beams in a time series manner.

5. A charged-particle beam producing apparatus comprising:
   a charged-particle beam producing source comprising a vacuum partition wall, wherein said vacuum partition wall has a multi-chamber structure wherein the degree of vacuum can be increased stepwise;
   driving means for driving said charged-particle beam producing source;
   detecting means provided on said vacuum partition wall, for detecting at least one of secondary charged-particles and reflected charged-particles, wherein said detecting means is disposed in an innermost portion wherein the degree of vacuum is highest; and
   control means for controlling the charged-particle beam.

6. An apparatus according to claim 5, wherein said detecting means comprises a p-n junction.

7. An apparatus according to claim 5, wherein a plurality of charged-particle beam producing sources are provided on a common base member.

8. An apparatus according to claim 7, wherein said plural charged-particle beam producing sources are selectively driven for different uses.

9. A charged-particle beam apparatus for drawing a pattern on a workpiece having a radiation sensitive material in accordance with prepared pattern data, said apparatus comprising:
   a plurality of charged-particle beam sources provided in a unidirectional array on a common base plate, wherein said charged-particle beam sources include beam emitting portions, each of a width d, which are disposed at a pitch D;
   moving means for relatively moving the workpiece and said base plate in a direction of an angle $\theta$ with respect to the array of said charged-particle beam sources, wherein $\theta = \sin^{-1}(d/kD)$ where $k \geq 1$; and
   timing controlling means for controlling the timing of emission of charged-particle beams emitted from said beam emitting portions in accordance with the pattern data and with the speed of the relative movement of the workpiece and the base plate.

10. An apparatus according to claim 9, wherein each of said beam emitting portions has a square shape having one side which is substantially parallel to the direction of relative movement.

11. An apparatus according to claim 9, wherein the following relation is satisfied:

$$D = d\sqrt{l^2 + (1/k)^2}$$

wherein l is an integral number and $k \geq 1$.

12. An apparatus according to claim 9, wherein the following relation is satisfied:

$$t = d/kv$$

where t is a clockpulse for controlling said timing and v is the speed of the relative movement and wherein $k \geq 1$.

13. An apparatus according to claim 9, wherein said charged-particle beam sources are disposed in arrays which are parallel to each other.

14. An apparatus according to claim 9, wherein said base plate is provided with a light emitting portion and a light receiving line sensor and wherein the light emitted from said light emitting portion is reflected by a plane parallel to a reference plane, representing the orientation of the workpiece, the reflected light being received by said light being received by said line sensor, whereby the attitude of the workpiece is detected.

15. An apparatus according to claim 9, wherein the array of charged-particle beam sources are disposed so that a line drawn by at least one beam source of one beam source array and a line, or an extension thereof, drawn by at least one beam source of another beam source array superpose upon one another.

16. An apparatus according to claim 9, further comprising magnification changing means effective to adjust at least one of the angle and said electron beam emission timing and the speed of the relative movement, to thereby change the pattern drawing magnification.

* * * * *

UNITED STATES PATENT AND TRADEMARK OFFICE
CERTIFICATE OF CORRECTION

PATENT NO. : 4,974,736

DATED : December 4, 1990

INVENTOR(S) : Masahiko Okunuki, et al

It is certified that error appears in the above-identified patent and that said Letters Patent is hereby corrected as shown below:

COLUMN 1

Line 29, "sources involve" should read --source involves--.

COLUMN 6

Line 63, "at time," should read --at one time,--.

COLUMN 13

Line 29, ""$\theta_M = \sin^{31\ 1}(d/kD)$"" should read --"$\theta_M = \sin^{-1}(d/kD)$"--.

COLUMN 14

Line 1, "of" should be deleted.

UNITED STATES PATENT AND TRADEMARK OFFICE
CERTIFICATE OF CORRECTION

PATENT NO. : 4,974,736

DATED : December 4, 1990

INVENTOR(S) : Masahilo Okuniki, et al

It is certified that error appears in the above-identified patent and that said Letters Patent is hereby corrected as shown below:

COLUMN 17

Line 42, "$D-d\sqrt{\ell^2+(1/k)^2}$" should read --$D=d\sqrt{\ell^2+(1/k)^2}$--.

COLUMN 18

Line 8, "upon" should be deleted; and
Line 37, "hole" should read --whole--.

Signed and Sealed this

Thirtieth Day of March, 1993

*Attest:*

STEPHEN G. KUNIN

*Attesting Officer*     *Acting Commissioner of Patents and Trademarks*